United States Patent [19]

Mieno et al.

[11] Patent Number: 5,233,163
[45] Date of Patent: Aug. 3, 1993

[54] GRAPHITE COLUMNAR HEATING BODY FOR SEMICONDUCTOR WAFER HEATING

[75] Inventors: Fumitake Mieno, Kawasaki; Yuji Furumura, Yokohama; Atsuhiro Tsukune; Hiroshi Miyata, both of Kawasaki, all of Japan

[73] Assignee: Fujitsu Limited, Kawasaki, Japan

[21] Appl. No.: 725,081

[22] Filed: Jul. 3, 1991

[30] Foreign Application Priority Data

Jul. 5, 1990 [JP] Japan ................... 2-176429

[51] Int. Cl.$^5$ .................. H01L 21/20; H01L 21/324
[52] U.S. Cl. .................... 219/390; 219/552; 392/416; 392/418; 118/725; 118/728; 338/333
[58] Field of Search ............... 392/416–418; 219/390, 405, 411, 552, 553; 118/724, 725, 728, 50.1; 427/50, 51, 55; 338/330, 333, 334

[56] References Cited

U.S. PATENT DOCUMENTS

| | | | |
|---|---|---|---|
| 3,042,494 | 7/1962 | Gutsche | 427/51 |
| 3,220,380 | 11/1965 | Schaarschmidt | 392/418 |
| 3,351,742 | 11/1967 | Harris | 219/552 |
| 3,436,255 | 4/1969 | Harris et al. | 219/552 |
| 3,820,935 | 6/1974 | Dietze | 118/724 |
| 4,724,621 | 2/1988 | Hobson et al. | 118/725 |
| 4,825,809 | 5/1989 | Mieno | 118/725 |
| 4,938,815 | 7/1990 | McNeilly | 219/540 |
| 4,978,567 | 12/1990 | Millen | 118/725 |

FOREIGN PATENT DOCUMENTS

2050076 4/1972 Fed. Rep. of Germany ...... 118/725

*Primary Examiner*—Bruce A. Reynolds
*Assistant Examiner*—John A. Jeffery
*Attorney, Agent, or Firm*—Staas & Halsey

[57] ABSTRACT

A heating apparatus for use in heating a substrate comprises an electric heater and a power supply part. The electric heater is made up of an approximately columnar body which is made of graphite, and this columnar body has a top with a flat surface part on which the substrate is placed and a pair of legs which extend downwardly from the flat surface part. The legs are defined by an opening in the columnar body. The power supplying part is coupled to the electric heater and supplies a voltage across the legs of the columnar body so that a current flows from one leg to the other, thereby generating heat at the flat surface part to heat the substrate.

23 Claims, 9 Drawing Sheets

GRAPHITE COLUMNAR HEATING BODY FOR SEMICONDUCTOR WAFER HEATING

BACKGROUND OF THE INVENTION

The present invention generally relates to heating apparatuses, and more particularly to a heating apparatus for use in chemical vapor deposition, annealing and the like when producing a semiconductor device.

There are various methods of heating when producing a semiconductor device. For example, there is a method which uses a lamp heater, a method which uses a high-frequency heater device, and a method which uses an electric heater made of graphite.

When using the lamp heater, a semiconductor wafer which is placed inside a process chamber is heated by irradiating an infrared ray from outside the process chamber via a light transmitting window which is formed in the process chamber. However, this method has a problem in that a reaction product within the process chamber becomes deposited on the light transmitting window, thereby gradually deteriorating the transmittance of the light transmitting window with time.

When using the high-frequency heater device, it is necessary to provide high-frequency coils within the process chamber. As a result, there is a problem in that the structure of the arrangement becomes complex. In addition, the power efficiency of this method is poor because of the indirect heating, and there is a problem in that the temperature cannot be raised quickly by this method.

The method which uses the electric heater made of graphite is one method which can eliminate the above described problems. The present invention relates to an improvement of a heating apparatus which uses an electric heater made of graphite when carrying out a heating process during production of a semiconductor device.

Figure 1:
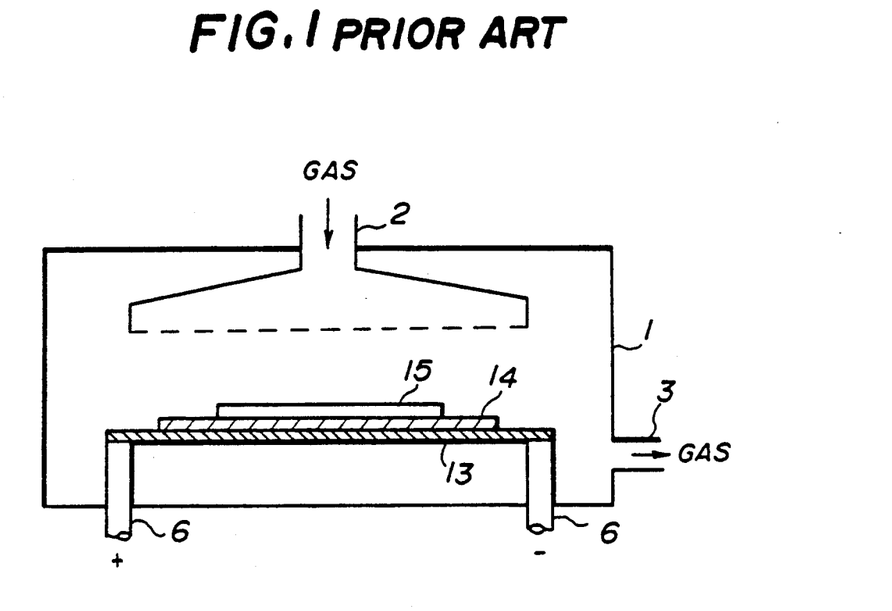
FIG. 1 is a cross sectional view showing an example of a conventional heating apparatus.

FIG. 1 shows a cross section of an example of a conventional heating apparatus using an electric heater made of graphite. In FIG.1, a process chamber 1 has a gas supply means 2 and a gas exhaust means 3, and an electric heater 13 made of graphite is provided within the process chamber 1. Ends of the electric heater 13 are connected to respective electrodes 6. A semiconductor wafer 15 is placed on a quartz plate 14, and this quartz plate 14 is provided on the electric heater 13. The electric heater 13, the quartz plate 14 and the electrodes 6 form an essential part of the heating apparatus.

Figure 2:
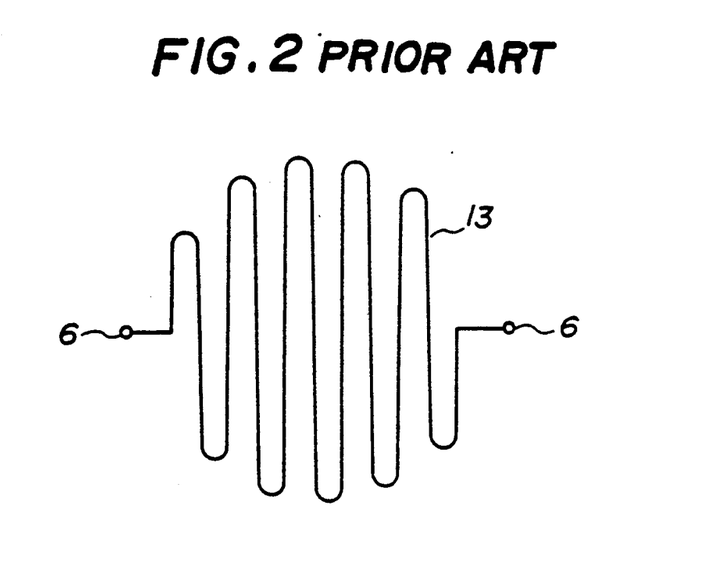
FIG. 2 is a plan view showing an electric heater of the conventional heating apparatus shown in FIG.1.

FIG. 2 shows a plan view of the electric heater 13. As shown in FIG. 2, the electric heater 13 has a zigzag pattern which generally exists within a circular boundary.

Accordingly, the semiconductor wafer 15 is heated by the electric heater 13 having the zigzag pattern, and there is a problem in that the entire surface of the semiconductor wafer 15 cannot be heated uniformly. In addition, because the semiconductor wafer 15 is heated indirectly via the quartz plate 14, there is a problem in that the power efficiency is poor.

SUMMARY OF THE INVENTION

Accordingly, it is a general object of the present invention to provide a novel and useful heating apparatus in which the problems described above are eliminated.

Another and more specific object of the present invention is to provide a heating apparatus for heating a substrate comprising an electric heater made up of an approximately columnar body which is made of graphite, where the columnar body has a top with a flat surface part on which the substrate is placed and a pair of legs which extend downwardly from the flat surface part and the legs are defined by an opening in the columnar body, and power supplying means, coupled to the electric heater, for supplying a voltage across the legs of the columnar body so that a current flows from one leg to the other, thereby generating heat at the flat surface part to heat the substrate. According to the heating apparatus of the present invention, it is possible to uniformly heat the substrate with a high efficiency.

Other objects and further features of the present invention will be apparent from the following detailed description when read in conjunction with the accompanying drawings.

DESCRIPTION OF THE PREFERRED EMBODIMENTS

Figure 3:
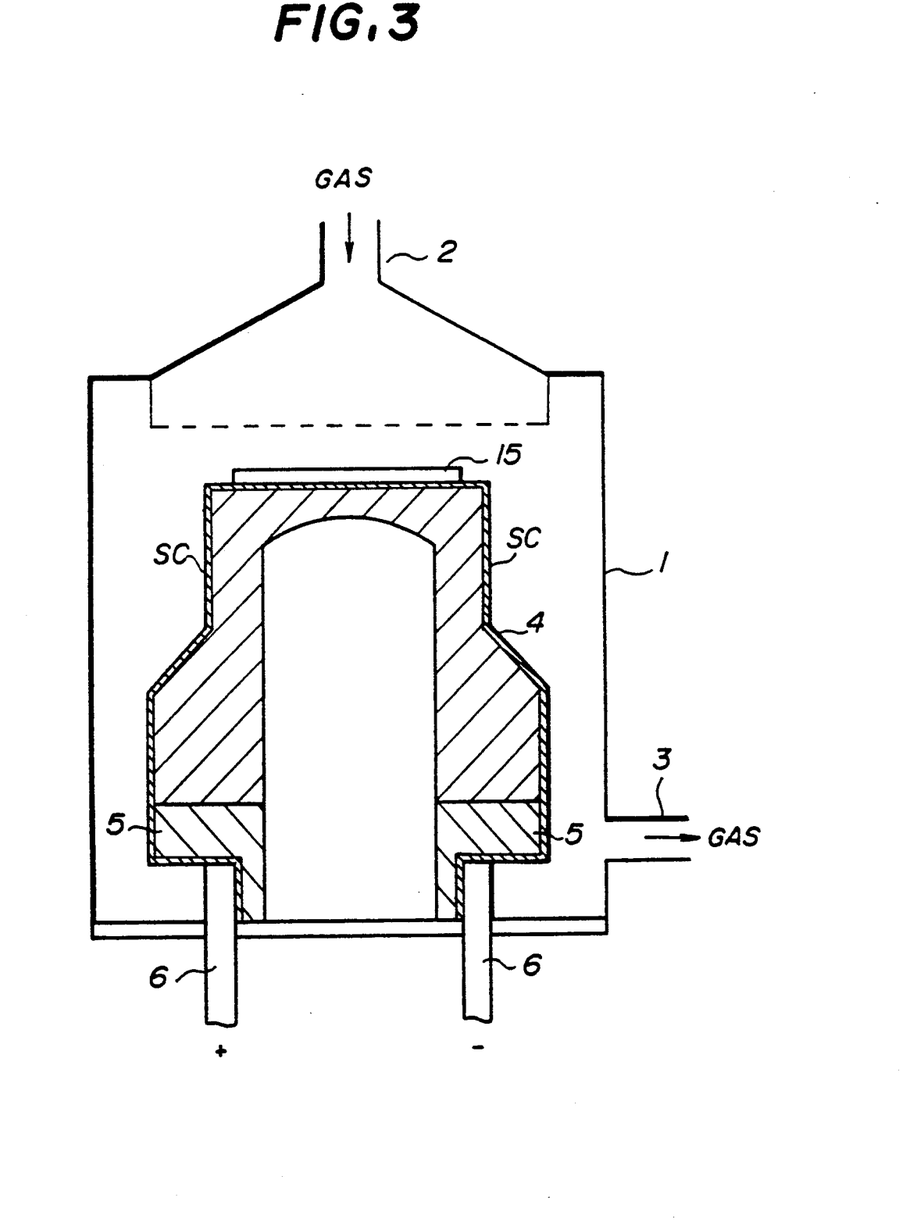
FIG. 3 is a cross sectional view showing a first embodiment of a heating apparatus according to the present invention.

A description will be given of a first embodiment of a heating apparatus according to the present invention, by referring to FIG.3. In FIG.3, those parts which are essentially the same as those corresponding parts in FIGS. 1 and 2 are designated by the same reference numerals, and a description thereof will be omitted.

In this embodiment, the heating apparatus includes an electric heater 4 made of graphite, mutually isolated power supplying parts 5 made of graphite, and the electrodes 6. The necessary voltage from a power source (not shown) is supplied to the electric heater 4 via the respectively associated electrodes 6 and power supplying parts 5.

Figure 4:
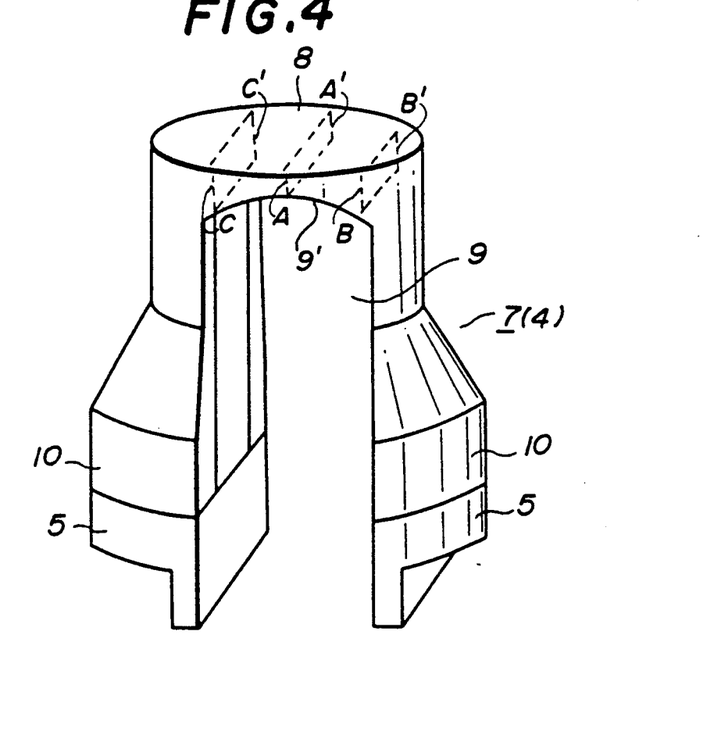
FIG. 4 is a perspective view showing an electric heater and a power supplying part of the first embodiment.
Figure 5:
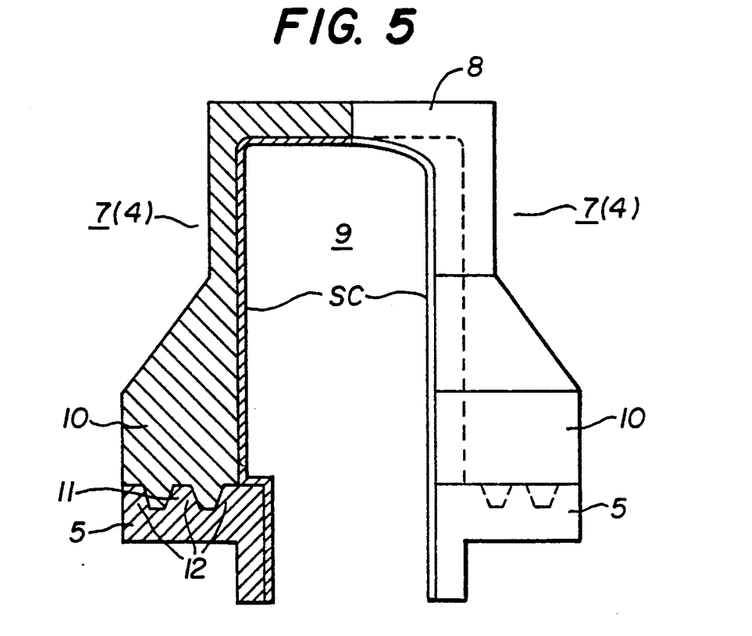
FIG. 5 is a composite view including in the left portion a cross-sectional view and in the right portion a side elevational view, respectively in transverse vertical planes, of the electric heater and the power supplying part of the first embodiment.

FIG. 4 is a perspective view of the electric heater 4 and the power supplying parts 5. On the other hand, FIG. 5 shows a cross section and a side view of the electric heater 4 and the power supplying parts 5 at two different locations. In other words, the right half of FIG. 5 shows the side view of the heating apparatus, while the left half of FIG. 5 shows the cross section of the heating apparatus along a plane which is perpendicular to the plan view of the heating apparatus shown in FIG. 3, that is, a plane parallel to the paper in FIG. 3. Hence, the dotted line in the side view on the right half of FIG. 5 corresponds to an end surface indicated by a solid line in the cross section on the left half of FIG. 5.

As may be seen from FIGS. 3 through 5, the electric heater 4 includes a cylindrical body 7 made of graphite and a flat surface part 8 forming the top of the cylindrical body 7. In addition, an opening 9 is formed in the lower part of the cylindrical body 7 to form a pair of approximately parallel legs 10. An interior bottom surface 9, the cylindrical body 7, which is opposite to the flat surface part 8 and is defined by the opening 9 has an arcuate shape, so that the cross sectional area of the cylindrical body 7, perpendicular to the direction of the current flow at successive locations spaced along a direction through the flat surface part 8 are approximately the same. In other words, the top edge of the opening 9 is curved so that the spaced cross sections A—A', B—B, and C—C, in FIG. 4 respectively have approximately the same area.

The bottom surface of each leg 10 has a semicircular shape, and as shown in FIG. 5, a plurality of concentric grooves 11 are formed on the bottom surface.

On the other hand, each of the power supplying parts 5 has a semicircular shape (i.e., in cross-sectional in a horizontal plane transverse to the axis of the body 8) and is made of graphite as described above, and a plurality of concentric rails 12 are formed on the top surface of each power supplying part 5. The concentric rails 12 engage the corresponding concentric grooves 11 of the legs 10 to support the electric heater 4. Of course, it is possible as an alternative to provide concentric rails on the bottom surface of each leg 10 and to provide the concentric grooves on the top surface of each power supplying part 5.

A silicon carbide layer SC is coated on the graphite surfaces of the electric heater 4 and the power supplying part 5, excluding the grooves 11 of the legs 10 and the rails 12 on the power supplying parts 5.

According to this embodiment, the cross section of each leg 10 is made sufficiently large, so that the heating takes place mainly at the flat surface part 8 which is provided at the top part of the cylindrical body 7. In addition, the rigidity or strength of the electric heater 4 is improved by the legs 10 which have a larger cross section towards the bottom part where the legs 10 connect to the power supplying parts 5. Furthermore, the cross sectional areas at successive, spaced positions in planes perpendicular to the direction of the at the flat surface part 8 are approximately the same, so that the resistance of the flat surface part 8 is uniformly distributed along the direction of the current flow. Therefore, it is possible to uniformly heat the entire surface of the flat surface part 8.

The legs 10 and the power supplying parts 5 of the electric heater 4 engage each other via the grooves 11 provided on the legs 10 and the rails 12 provided on the power supplying parts 5. For this reason, the stress which is generated when the electric heater 4 undergoes thermal expansion is effectively suppressed at the engaged portions of the legs 10 and the parts 5, i.e., where the grooves 11 engage the corresponding rails 12, thereby preventing cracks from being formed in the electric heater 4. Furthermore, the electric heater 4 is highly resistant to reactive gasses because of the silicon carbide layer SC which covers the graphite surfaces except for the conductor contact surfaces.

For example, the heating apparatus is used as follows during a process used for the production of a semiconductor device. First, the gas exhaust means 3 is used to evacuate the inside of the process chamber 1 i.e., produce vacuum therein. Then, the gas supply means 2 is used to supply disilane ($Si_2H_6$) at 10 SCCM, hydrogen ($H_2$) at 30 SCCM, and phosphine ($PH_3$) at 1 SCCM. The pressure within the process chamber 1 is maintained at 5 Torr while the gas supply means 2 supplies the gases. A voltage is applied across the electrodes 6 so that a current flows through the electric heater 4 from one electrode 6 via one power supply part 5 to the other electrode 6 via the other power supply part 5, that is, from one leg 10 to the other leg 10.

According to one experiment conducted by the present inventors, the diameter of the flat surface part 8 was approximately 200 mm and the average thickness between the interior bottom surface 91 defined by the opening 9 and the flat surface part 8 was approximately 3 mm. In addition, the average width of the leg 10 at the top portion thereof, connected integrally to the flat surface part 8 was approximately 4 mm. The applied voltage was 14 V and the current which flowed was 1400 A. A silicon (Si) wafer having a diameter of 6 inches was placed on the electric heater 4 as the semiconductor wafer 15 and heated to approximately 950° C.

A process of epitaxially growing a Si layer on the semiconductor wafer 15 (Si wafer) was carried out under the above described conditions for 100 different Si wafers. As a result, it was confirmed that no slip line is generated on the semiconductor wafer 15 by the epitaxial growth process and a satisfactory Si layer was formed. Hence, it was confirmed that approximately the entire region of the flat surface part 8 of the electric heater 4 is held at approximately the same temperature.

Figures 6A, 6B:
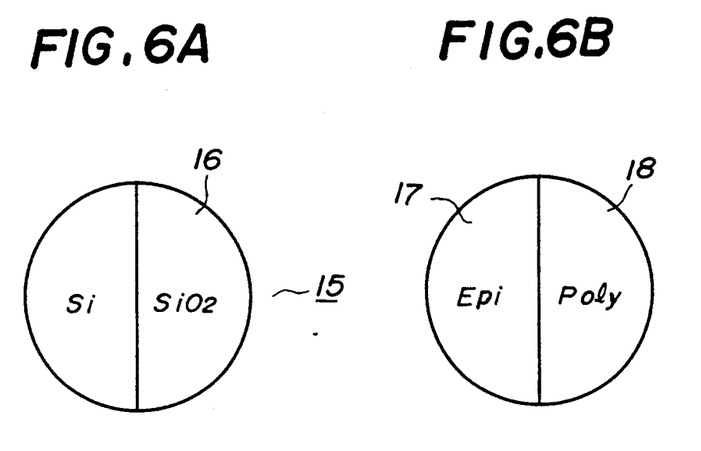
FIGS. 6A through 6D are plan views of a semiconductor wafer for explaining measurement of a thickness of a silicon layer which is formed by a chemical vapor deposition.
Figures 6C, 6D:
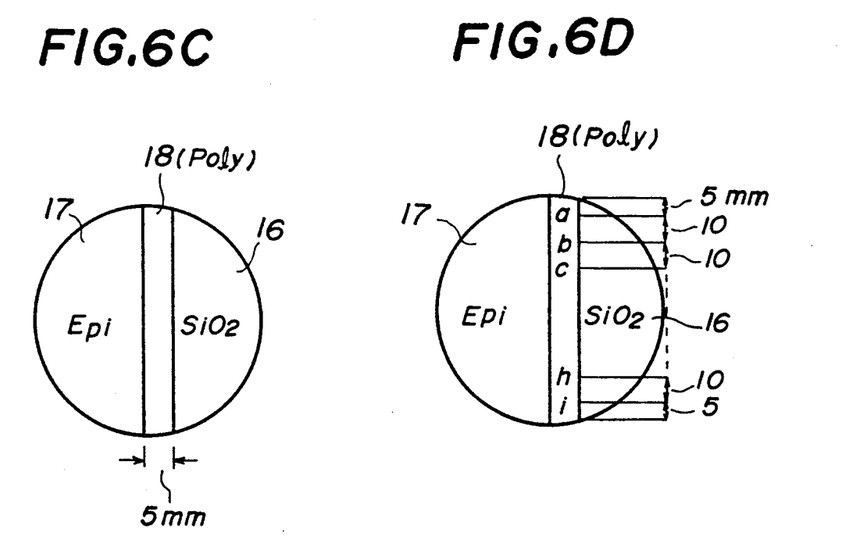

Next, a description will be given of another experiment conducted by the present inventors. In this experiment, a Si wafer having a diameter of 4 inches was used as the semiconductor wafer 15. First, a silicon dioxide ($SiO_2$) layer 16 was formed on the right half of the surface of the semiconductor wafer (Si wafer) 15 as shown in FIG. 6A. Then the heating apparatus of the present invention was used to form a Si layer on the entire surface of the semiconductor wafer 15 by a chemical vapor deposition, so as to form a polysilicon layer 18 on the right half and an epitaxial silicon (Si) layer 17 on the left half of the semiconductor wafer 15 as shown in FIG. 6B. Next, as shown in FIG. 6C, an etching was made with respect to the polysilicon layer 18 to remove the polysilicon layer 18 from a region excluding a central band-shaped region having a width of 5 mm, so that the polysilicon layer 18 remains in the band-shaped region. The thickness of the remaining polysilicon layer 18 was then measured at points a, b, c, ..., h and i shown in FIG. 6D.

The following Table shows the results of the above measurements carried out for four different Si wafers A, B, C and D at the points a, b, c, ..., h and i. The value under "distribution" was calculated from the following formula.

Distribution
= [(Maximum-Minumum)/(Maximum+-Minimum)]×100

TABLE

| Point | Wafer A | Wafer B | Wafer C | Wafer D |
|---|---|---|---|---|
| a | 7035 | 7155 | 6950 | 6920 |
| b | 7000 | 7275 | 7105 | 7165 |
| c | 7065 | 7285 | 6865 | 7010 |
| d | 7120 | 7050 | 6865 | 7020 |
| e | 7035 | 7220 | 6905 | 7225 |
| f | 7020 | 7255 | 6850 | 7100 |
| g | 7035 | 7250 | 6980 | 7225 |
| h | 7020 | 7290 | 6950 | 7200 |
| i | 6980 | 7285 | 6900 | 7090 |
| Distribution | ±1.0% | ±1.7% | ±2.2% | ±2.1% |

Total Distribution: ±3.1%

As is clear from the data shown in the Table, the polysilicon layer 18 is uniformly formed on the semiconductor wafer (Si wafer) 15 to approximately the same thickness. Further, it was also confirmed that the epitaxial Si layer 17 formed on the left half of the semiconductor wafer 15 has satisfactory crystal properties. From these measurements, it was confirmed that the entire surface of the semiconductor wafer 15 is uniformly heated by the heating apparatus according to the present invention.

Figure 7:
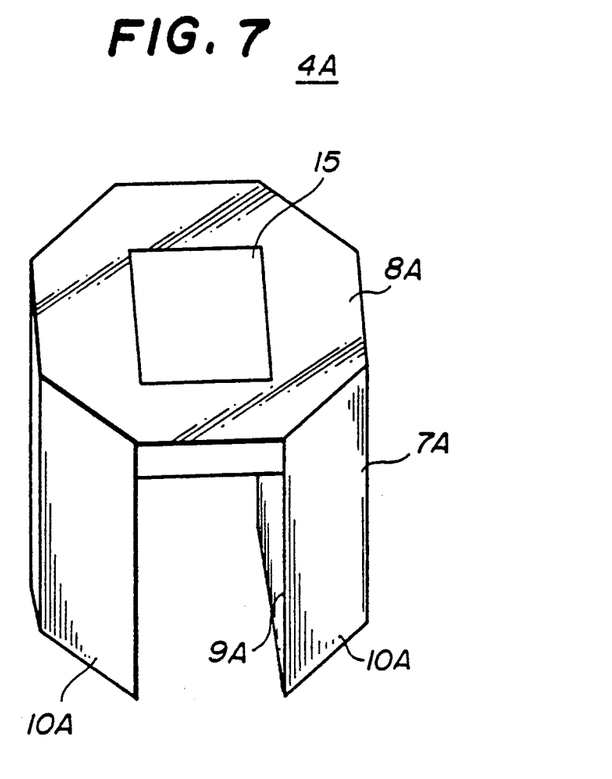
FIG. 7 is a perspective view showing an essential part of a second embodiment of the heating apparatus according to the present invention.

Next, a description will be given of a second embodiment of the heating apparatus according to the present invention, by referring to FIG.7. In this embodiment, an electric heater 4A is made up of a hexagonal column body 7A having a pair of legs 10A. An opening in a horizontal plane transverse to the central vertical axis of the body 7A has a generally rectangular shape. A flat surface part 8A at the top of the hexagonal column body 7A has a generally hexagonal shape in a horizontal plane transverse to the central vertical axis of the body 7A, and the semiconductor wafer 15 is placed on this flat surface part 8A. For example, the semiconductor wafer 15 may has a circular shape or a rectangular shape as shown in FIG. 7. In other words, the shape of the flat surface part 8A is selected in correspondence with the shape of the semiconductor wafer 15. The illustration of the power supplying parts and the electrodes is omitted in FIG. 7.

The cross sectional areas along a direction perpendicular to the direction of the current flow at the flat surface part 8A are approximately the same within the region an which the semiconductor wafer 15 is placed, so that the resistance of the flat surface part 8A within this region is uniformly distributed along the direction of the current flow. Therefore, it is possible to uniformly heat the semiconductor wafer 15.

Figure 8:
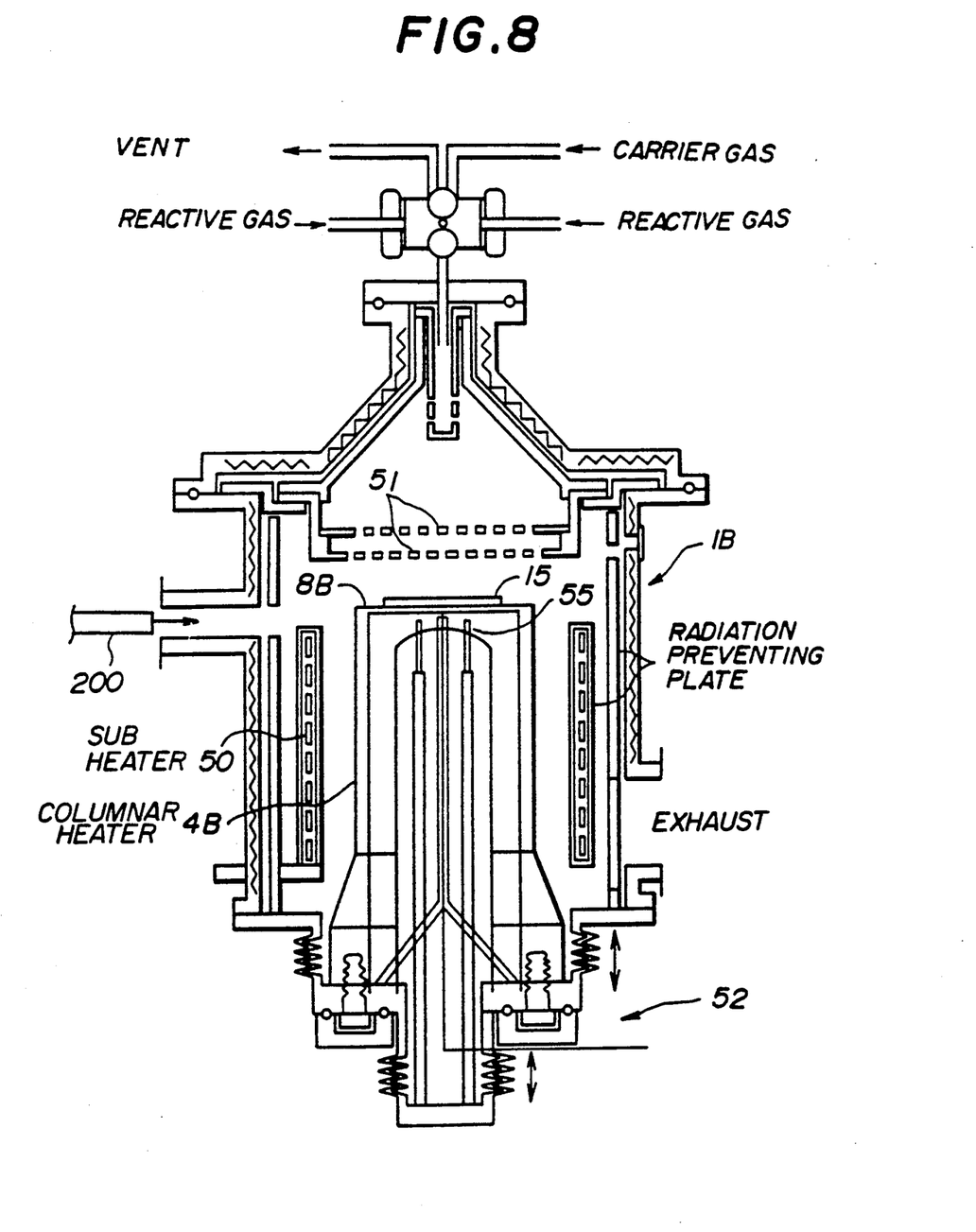
FIG. 8 is a cross sectional view showing a third embodiment of the heating apparatus according to the present invention.

FIG. 8 shows a cross section of a third embodiment of the heating apparatus according to the present invention. In FIG. 8, those parts which are essentially the same as those corresponding parts in FIG. 3 are designated by the same reference numerals with a letter "B" after the reference numeral, and a description thereof will be omitted.

In this embodiment, a sub heater 50 surrounds the sides of an electric heater 4B. The sub heater 50 may be provided intermittently or continuously around the sides of the electric heater 4B. The sub heater 50 may be provided intermittently or continuously around the sides of the electric heater 4B. During a thermal process within a process chamber 1B, unwanted particle deposits may be formed on the surfaces of the electric heater 4B. But in this embodiment, it is possible to forcibly form the particle deposits on the surfaces of the sub heater 50 by setting the temperature of the sub heater 50 greater than that of the electric heater 4B. As a result, the undesirable particle deposits form on the surfaces of the electric heater 50. In addition, the provision of the sub heater 50 improves the temperature uniformity on the flat surface part 8B of the electric heater 4B along the horizontal direction in FIG. 8.

Furthermore, carrier and reactive gasses are supplied onto the semiconductor wafer 15 via a shower plate 51. This shower plate 51 has a plurality of holes for uniformly supplying the gasses onto the surface of the semiconductor wafer 15. The shower plate 51 and the operation related thereto are further disclosed in a U.S. Pat. No. 4,825,809, the disclosure of which is hereby incorporated by reference. In other words, the heating apparatus according to the present invention is applicable to a chemical vapor deposition apparatus of the type shown in the U.S. Pat. No. 4,825,809, for example.

In FIG. 8, an elevator mechanism 52 is provided to adjust the relative positions of the shower plate 51 and the electric heater 4B. Further, an arm 200 is provided to transport the semiconductor wafer 15 to and from the process chamber 1.

Figure 9A:
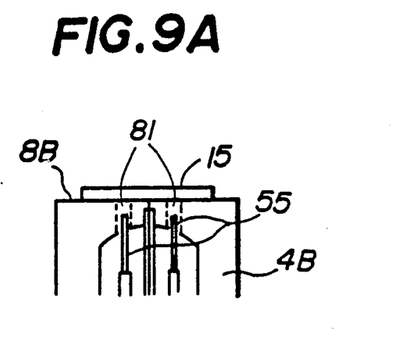
FIGS. 9A and 9B respectively are cross sectional views for explaining an operation of lift pins shown in FIG. 8.
Figure 9B:
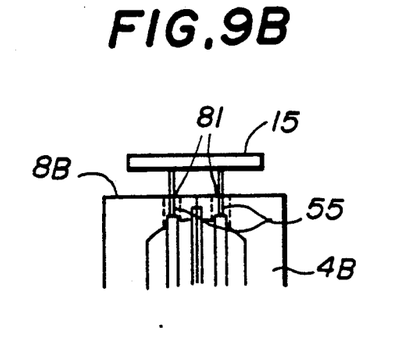

FIGS. 9A and 9B show the lift pins 55, illustrated in FIGS. 8, on a relatively larger scale. Normally, lift pins 55 are in a rest position where the tip of the lift pins 55 do not penetrate the flat surface part 8B of the electric heater 4B as shown in FIG.9A. However, when placing or removing the semiconductor wafer 15 onto or from the flat surface part 8B, a known elevator mechanism (not shown) raises the lift pins 55 to a lifted, or raised, position as shown in FIG. 9B.

Figure 10:
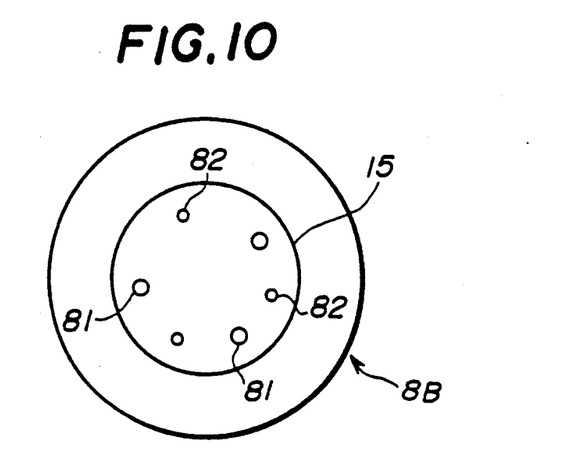
FIG. 10 is a plan view showing a flat surface part of an electric heater of the third embodiment.

Holes 81 and 82 are formed in the flat surface part 8B as shown in FIG. 10. When the left pins 55 are raised to the lifted position shown in FIG. 9B, the lift pins 55 penetrate through the corresponding holes 81 of the flat surface part 8B and lift the semiconductor wafer 15. Hence, an arm (not shown) can transport the lifted semiconductor wafer 15 to another location within or outside the process chamber lB. The holes 82 are provided so as to improve the symmetry and maintain a uniform temperature distribution on the flat surface part 8B.

According to the experiments conducted by the present inventors, it was confirmed that the temperature distribution on the flat surface part 8B is virtually unaffected by the provision of the holes 81 and 82, provided that the holes 81 and 82 are sufficiently small. For example, in the case of a flat surface part 8B having a diameter of 160 mm, it was confirmed that no deterioration is seen in the uniform temperature distribution on the flat surface part 8B when the holes 81 and 82 have a diameter of 5 mm or less. In this embodiment, the diameter of the holes 81 was set to 5 mm and the diameter of the holes 82 was set to 3 mm.

Figure 11:
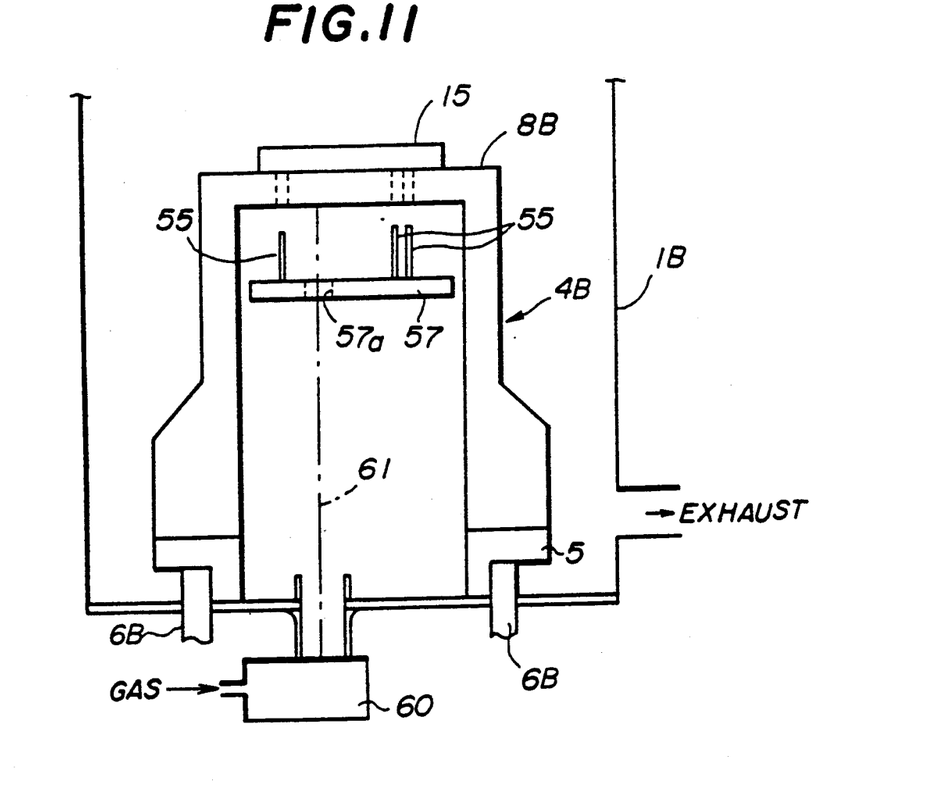
FIG. 11 is a cross sectional view showing an essential part of the third embodiment for explaining an operation of a temperature sensor.

FIG. 11 shows an essential part of an arrangement for detecting a temperature of the flat surface part 8B in this embodiment. The lift pins 55 are provided on a movable base 57 which is raised and lowered by a known elevator mechanism (not shown). A hole 57a is formed in the movable base 57. An optical sensor 60 is provided at the bottom part of the process chamber IB, and this optical sensor 60 optically senses the temperature at the back surface of the flat surface part 8B via a path 61 which penetrates through the hole 57a in the movable base 57. Preferably, a predetermined gas is supplied to the optical sensor 60 so as to prevent fogging of a window (not shown) of the optical sensor 60.

According to this arrangement, it is possible to accurately detect the temperature at the flat surface part 8B of the electric heater 4B. In order to improve the temperature detection accuracy, the back surface of the flat surface part 8B is preferably made of graphite, that is, preferably not coated with silicon carbide. The detected temperature of the flat surface part 8B can be fed back to the operator so as to control the voltage which is applied across electrodes 6B for the purpose of fine adjusting the current level supplied to the flat surface part 8B thereby to achieve the desired temperature.

Of course, a similar arrangement may be provided with respect to the sub heater 50.

Next, descriptions will be given of embodiments of connections between the electric heater 4 and the power supplying parts 5, by referring to FIGS. 12 through 15. In FIGS. 12 through 15, those parts which are essentially the same as those corresponding parts in FIGS. 3 through 5 are designated by the same reference numerals, and a description thereof will be omitted.

Figure 12:
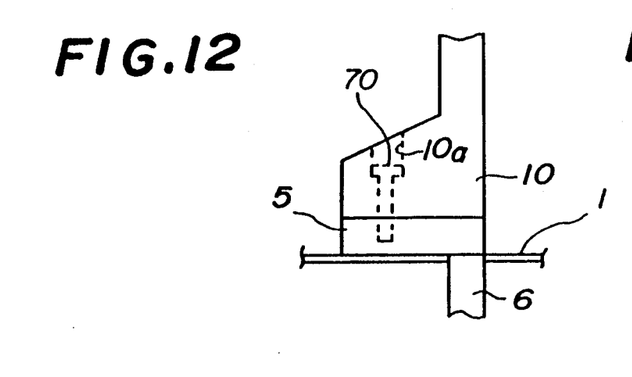
FIGS. 12 through 15 respectively are cross sectional views showing essential parts of embodiments of connections between the electric heater and the power supplying parts.

According to the connection shown in FIG. 12, the leg 10 of the electric heater 4 is connected to the corresponding power supplying part 5 by a bolt 70 which penetrates through a hole 10a in the leg 10.

Figure 13:
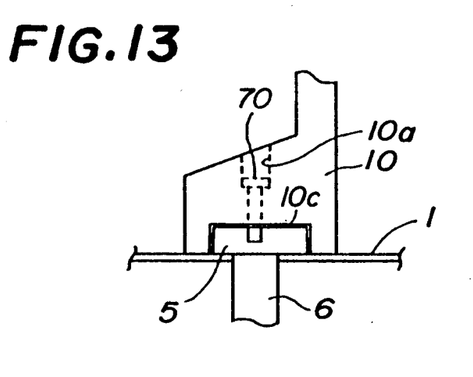

On the other hand, according to the connection shown in FIG. 13, the leg 10 of the electric heater 4 is connected to the corresponding power supplying part 5 by the bolt 70 which penetrates through the hole 10a in the leg 10. In this connection, the power supplying part 5 is received within a recess 10c and thus covered by the leg 10.

In FIGS. 12 and 13, the bolt 70 is arranged vertically. However, it is possible to arranged a bolt 71 horizontally as shown in FIGS. 14 and 15.

Figure 14:
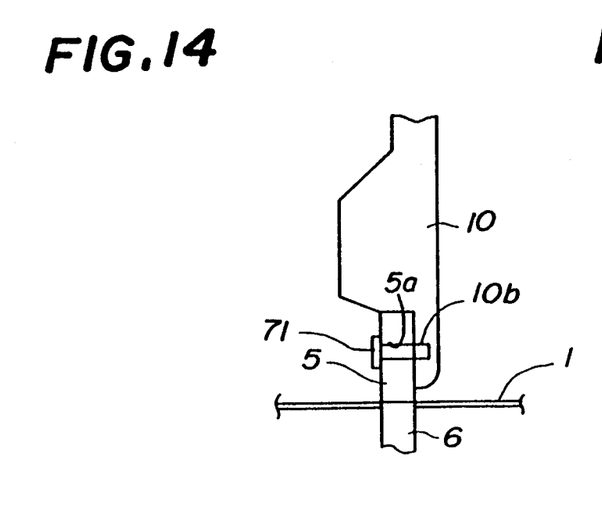

According to the connection shown in FIG. 14, the leg 10 of the electric heater 4 is connected to the corresponding power supplying part 5 by the bolt 71 which penetrates through a hole 5a in the power supplying part 5 and engages a hole 10b in the leg 10. In this connection, the bolt is partially covered by the overhanging part of the leg 10.

Figure 15:
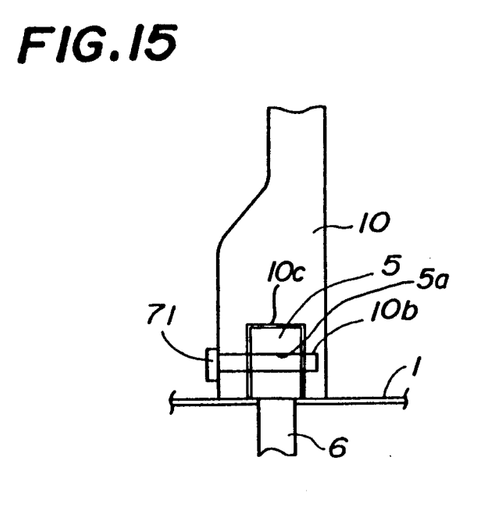

On the other hand, according to the connection shown in FIG. 15, the leg 10 of the electric heater 4 is connected to the corresponding power supplying part 5 by the bolt 71 which penetrates through the hole 5a in the power supplying part 5 and engages the hole 10b in the leg 10. In this connection, the power supplying part 5 is received within a recess 10c and thus covered by the leg 10.

In FIGS. 12 through 15, the bolts 70 and 71 may be made of a material selected from a group which consists of non-metals such as carbon, silicon carbide coated carbon, silicon carbide, amorphous carbon, boron nitride and the like. When such materials are used for the bolts 70 and 71, it is possible to prevent unwanted impurities of the bolts 70 and 71 from contaminating a layer which is formed on the semiconductor wafer 15 during a thermal process. The connections shown in FIGS. 13 and 15 are preferable in that the electrode 6 which makes contact with the power supplying part 5 will not be exposed within the process chamber 1. This is because the exposure of the electrode 6 may generate undesirable electrode particles which contaminate the layer which is formed on the semiconductor wafer during the thermal process. However, since the reaction related to the deposition occurs mainly in the vicinity of the flat surface part 8, the electrode 6 exposed at the lower part of the process chamber 1 is unlikely to cause serious problems, particularly when the overhanging part of the power supply part 5 or the leg 10 partially covers the electrode 6 as shown in FIGS. 3, 12 and 14.

Moreover, although the illustration is omitted in FIG. 3, a gasket made of copper, for example, is interposed between the power supplying part 5 and the process chamber 1 at each part where the electrode 6 penetrates the process chamber 1. However, such an arrangement is well known in the art, and the illustration of such an arrangement is also omitted in FIGS. 12 through 15 to simplify the drawings.

Figure 16:
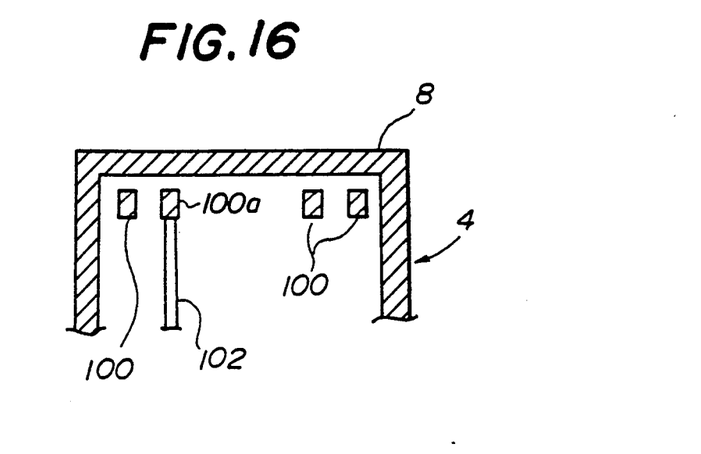
FIGS. 16 and 17 respectively are a cross sectional view and a plan view showing an essential part of a fourth embodiment of the heating apparatus according to the present invention.
Figure 17:
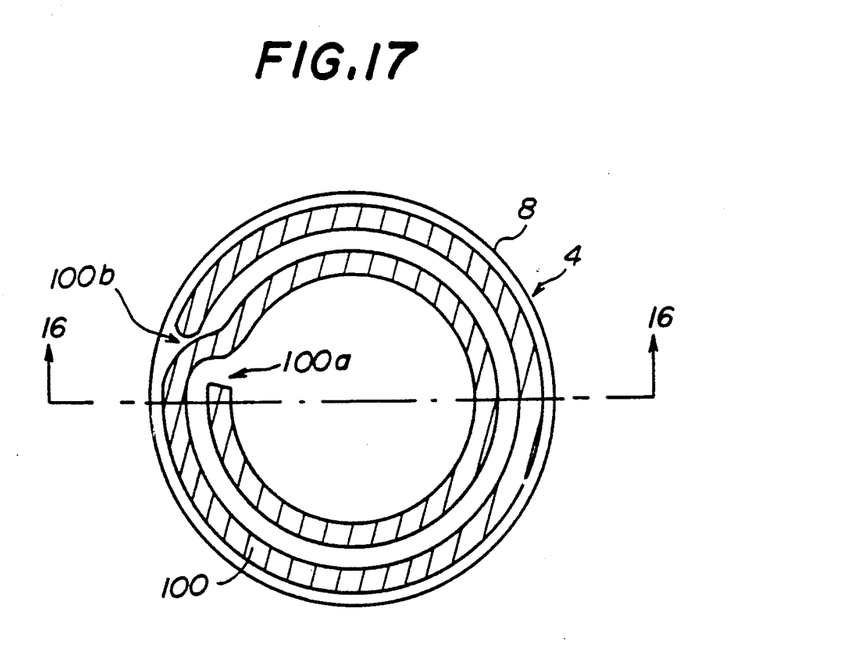

In order to improve the uniformity of the temperature distribution on the flat surface part 8, it is also possible to provide a sub heater inside the cylindrical body 7. FIGS. 16 and 17 show an essential part of a fourth embodiment of the heating apparatus according to the present invention having such a sub heater. In FIGS. 16 and 17, those parts which are the same as those corresponding parts in FIGS. 3 through 5 are designated by the same reference numerals, and a description thereof will be omitted. FIG. 16 shows a cross section taken along a one-dot chain line 16—16 in FIG. 17.

A sub heater 100 is provided under the flat surface part 8 as shown in FIG. 16. An electrode 102 is connected to one end 100a of the sub heater 100, and another electrode (not shown) is connected to the other end 100b of the sub heater 100.

Of course, the shape of the flat surface part 8 of the electric heater 4 is not limited to those of the described embodiments, and may have any shape which is selected in correspondence with the shape of the semiconductor wafer 15.

Further, the present invention is not limited to these embodiments, but various variations and modifications may be made without departing from the scope of the present invention.

What is claimed is:

1. A heating apparatus for heating a substrate, said heating apparatus comprising:
    an electric heater made of graphite and having an approximately columnar body with a top and a bottom, the top defining a flat surface part having a region thereon on which the substrate is placed, and a pair of legs which extend downwardly from the flat surface part to the bottom, said legs being defined by a central opening in the columnar body extending from the bottom and toward the top thereof and defining an interior bottom surface opposite to the flat surface part of the top, cross-sectional areas of the flat surface part at successive spaced positions in a direction perpendicular to the direction of the current flow through the flat surface part being approximately constant at least within the region, so that the resistance of the flat surface part within the region is uniformly distributed along the direction of the current flow therethrough; and power supplying means, coupled to said legs at the bottom of said electric heater, for supplying a voltage across the legs of the columnar body so that a current flows from one leg to the other leg of the pair thereof, thereby generating heat at the flat surface part to heat the substrate.

2. The heating apparatus as claimed in claim 1, wherein the flat surface part has a shape which is selected in correspondence with the shape of the substrate.

3. The heating apparatus as claimed in claim 2, wherein said columnar body has an approximately cylindrical shape.

4. The heating apparatus as claimed in claim 1, wherein said columnar body has an approximately hexagonal shape.

5. The heating apparatus as claimed in claim 1, wherein the central opening in the columnar body as a curved upper end defining a curved interior bottom surface, opposite to the flat surface part of the top, so that the cross-sectional areas of the flat surface part, at successive spaced positions in a direction perpendicular to the direction of the current flow in the flat surface part, are approximately constant.

6. The heating apparatus as claimed in claim 1, wherein outer surfaces of said electric heater, excluding parts of the legs which are coupled to said power supplying means, are coated with silicon carbide.

7. The heating apparatus as claimed in claim 1, wherein each leg is of successively larger cross-sectional areas, in progressing from the top and towards the bottom, where the leg is coupled to said power supplying means, so that heating by the current flow is generated mainly at the flat surface part of the top of the columnar body.

8. The heating apparatus as claimed in claim 1, wherein the flat surface part has a plurality of holes for adjusting the temperature distribution on the flat surface part.

9. The heating apparatus as claimed in claim 1, which further comprises a process chamber, first means for supplying at least one kind of gas into said process chamber, and second means for exhausting the gas inside said process chamber, said electric heater being provided within said process chamber.

10. The heating apparatus as claimed in claim 9, wherein said power supplying means includes a pair of power supplying parts connected to the respective legs at the bottom of the columnar body and located within said process chamber, and a pair of electrodes which connect to the respective power supplying parts by penetrating into said process chamber from outside said process chamber, said power supplying parts being made of graphite.

11. The heating apparatus as claimed in claim 10, wherein each leg has a bottom surface provided with at least one first engaging part, and each power supplying part has a top surface provided with at least one second engaging part which is provided in correspondence with the first engaging part, said first and second engaging parts being corresponding groove and rail parts which fit together to connect the corresponding leg and power supplying part.

12. The heating apparatus as claimed in claim 10, wherein at least one of each leg and corresponding power supplying part has an overhanging part which covers the corresponding electrode.

13. The heating apparatus as claimed in claim 10, wherein each leg and corresponding power supplying part are connected via a volt, said bolt being made of a material selected from the group consisting of carbon, silicon carbide coated carbon, silicon carbide, amorphous carbon, boron nitride and other non-metals.

14. The heating apparatus as claimed in claim 9, which further comprises a plurality of pins which are movable between a rest position and a raised position, and the flat surface part of the columnar body includes a plurality of first holes for permitting penetration of said pins in the raised position for lifting the substrate from the flat surface part.

15. The heating apparatus as claimed in claim 14, wherein the flat surface part of the columnar body further includes second holes for adjusting the temperature distribution on the flat surface part.

16. The heating apparatus as claimed in claim 9, which further comprises temperature sensor means for detecting the temperature of the interior bottom surface of the top of the columnar body.

17. The heating apparatus as claimed in claim 16, wherein said temperature sensor means optically detects the temperature of the interior bottom surface.

18. The heating apparatus as claimed in claim 17, wherein outer surfaces of said electric heater are coated with silicon carbide, excluding the parts of the legs which are coupled to said power supplying means and the part of the interior bottom surface of the top, the temperature of which is sensed by the temperature sensor means.

19. The heating apparatus as claimed in claim 1, which further comprises a sub heater which generally surrounds an outer periphery of the columnar body of said electric heater.

20. The heating apparatus as claimed in claim 1, which further comprises a sub heater which is provided inside the columnar body of said electric heater in the vicinity of the flat surface part.

21. A heating apparatus for heating a substrate, said heating apparatus comprising:

a process chamber, first means for supplying at least one kind of gas into said process chamber, and second means for exhausting the gas inside said process chamber;

an electric heater provided within said process chamber, and having an approximately columnar body which is made of graphite, said columnar body with a top and bottom, the top defining a flat surface part on which the substrate is placed and a pair of legs which extend downwardly from the flat surface part to the bottom, said legs being defined by a central opening in the columnar body extending from the bottom and toward the top thereof and defining an interior bottom surface opposite to the flat surface part of the top;

power supplying means for supplying a voltage across the legs of the columnar body so that a current flows from one leg to the other leg of the pair thereof, thereby generating heat at the flat surface part to heat the substrate, said power supplying means having a pair of power supplying parts made of graphite and connected to the respective legs at the bottom of the columnar body and located within said process chamber, and a pair of electrodes which connect to the respective power supplying parts by penetrating into said process chamber from outside said process chamber; and each leg having a bottom surface provided with at least one first engaging part, and each power supplying part having a top surface provided with at least one second engaging part which is provided in correspondence with the first engaging part, said first and second engaging parts being corresponding groove and rail parts which fit together to connect the corresponding leg and power supplying part.

22. The heating apparatus as claimed in claim 21 wherein at least one of each leg and corresponding power supplying part has an overhanging part which covers the corresponding electrode.

23. The heating apparatus as claimed in claim 21, wherein each leg and corresponding power supplying part are connected via a bolt, said bolt being made of a material selected from the group consisting of carbon, silicon carbide coated carbon, silicon carbide, amorphous carbon boron nitride and other non-metals.

* * * * *

UNITED STATES PATENT AND TRADEMARK OFFICE
CERTIFICATE OF CORRECTION

PATENT NO. : 5,233,163
DATED : Aug. 3, 1993
INVENTOR(S) : MIENO et al.

It is certified that error appears in the above-indentified patent and that said Letters Patent is hereby corrected as shown below:

Col. 3, line 30, change "9," to --9' of--;
line 31, after "9" insert --,--;
line 33, after "7," insert --at successive locations spaced along a direction--;
line 34, delete "at successive locations spaced along a";
line 35, delete "direction";
line 38, change "B-B" to --B-B'-- and change "C-C" to --C-C'--;
line 45, change "8" to --7--;
line 68, after "the" (second occurrence) insert --current flow--.

Col. 4, line 22, after "1" insert --,--;
line 23, after "duce "insert --a--.

Col. 5, line 4, change "thiokness" to --thickness--;
line 43, change "in a" to --9A--;
line 44, delete "horizontal plane transverse to the central vertical axis of";
line 45, delete "the body 7A", and after "shape" insert --in a horizontal plane transverse to the central vertical axis of the body 7A--;
line 51, change "has" to --have--;
line 60, change "an" to --on--.

Signed and Sealed this

Twenty-third Day of August, 1994

Attest:

BRUCE LEHMAN

Attesting Officer

Commissioner of Patents and Trademarks